(12) United States Patent
Cho et al.

(10) Patent No.: US 9,955,577 B2
(45) Date of Patent: Apr. 24, 2018

(54) CONDUCTIVE COMPONENT AND ELECTRONIC DEVICE INCLUDING THE SAME

(71) Applicant: SAMSUNG ELECTRONICS CO., LTD., Suwon-si, Gyeonggi-do (KR)

(72) Inventors: Youngjin Cho, Suwon-si (KR); Hyeon Cheol Park, Hwaseong-si (KR); Kwanghee Kim, Seoul (KR); Weonho Shin, Seoul (KR); Daejin Yang, Yeongju-si (KR)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 15/133,352

(22) Filed: Apr. 20, 2016

(65) Prior Publication Data
US 2017/0188456 A1    Jun. 29, 2017

(30) Foreign Application Priority Data

Dec. 23, 2015 (KR) .................. 10-2015-0185256

(51) Int. Cl.
*H05K 1/09* (2006.01)
*H05K 1/02* (2006.01)
(Continued)

(52) U.S. Cl.
CPC .............. *H05K 1/09* (2013.01); *G06F 3/047* (2013.01); *H01L 51/5206* (2013.01); *H01L 51/5234* (2013.01); *H05K 1/0274* (2013.01); *H01L 2251/301* (2013.01); *H01L 2251/5338* (2013.01); *H05K 2201/0323* (2013.01);
(Continued)

(58) Field of Classification Search
CPC ....... H05K 1/02; H01L 23/42; H01L 31/0224; H01B 13/00
USPC ........... 174/251, 253; 427/74, 108–110, 122, 427/240, 457, 508, 560, 596, 600;
(Continued)

(56) References Cited

U.S. PATENT DOCUMENTS 8,597,738 B2 * 12/2013 Yu ...................... C01B 31/0453
427/240
8,920,682 B2 * 12/2014 Texter ................. C08F 293/005
252/510

(Continued)

FOREIGN PATENT DOCUMENTS

CN    103236320 A    8/2013
JP    2013208881 A   10/2013
(Continued)

OTHER PUBLICATIONS

Lee et al., "High-Performance, Transparent, and Stretchable Electrodes Using Graphene-Metal Nanowire Hybrid Structures", Nano Letters, vol. 13, 2013, pp. 2814-2821.
(Continued)

*Primary Examiner* — Xiaoliang Chen
(74) *Attorney, Agent, or Firm* — Cantor Colburn LLP

(57) ABSTRACT

A conductive component including: a substrate, a first layer comprising a plurality of island structures disposed on the substrate, wherein the island structures include graphene; and a second layer disposed on the first layer, wherein the second layer includes a plurality of conductive nanowires. Also, an electronic device including the conductive component.

16 Claims, 7 Drawing Sheets

(51) Int. Cl.
  *H01L 51/52* (2006.01)
  *G06F 3/047* (2006.01)
(52) U.S. Cl.
  CPC ........... *H05K 2201/0338* (2013.01); *H05K 2201/0373* (2013.01); *H05K 2201/0379* (2013.01); *H05K 2201/0391* (2013.01)
(58) Field of Classification Search
  USPC ....... 428/143, 216, 221, 367, 398, 339, 457, 428/483; 429/211, 213, 209, 300
  See application file for complete search history.

(56) References Cited

U.S. PATENT DOCUMENTS

| | | | |
|---|---|---|---|
| 9,034,687 B2 | 5/2015 | Sato et al. | |
| 9,324,508 B2 | 4/2016 | Radivojevic et al. | |
| 9,455,421 B2 | 9/2016 | Li | |
| 9,793,437 B2 | 10/2017 | Morreale et al. | |
| 9,846,317 B2 | 12/2017 | Kadono et al. | |
| 2003/0044608 A1* | 3/2003 | Yoshizawa | B32B 9/00 428/398 |
| 2008/0149900 A1* | 6/2008 | Jang | H01B 1/122 252/511 |
| 2008/0268318 A1* | 10/2008 | Jang | H01M 8/0206 429/492 |
| 2011/0216020 A1 | 9/2011 | Lee et al. | |
| 2012/0045688 A1* | 2/2012 | Liu | H01G 11/06 429/207 |
| 2012/0070612 A1* | 3/2012 | Lee | B32B 9/007 428/141 |
| 2012/0141799 A1* | 6/2012 | Kub | B82Y 30/00 428/408 |
| 2012/0195821 A1* | 8/2012 | Sun | C01B 31/0273 423/448 |
| 2012/0228110 A1 | 9/2012 | Takahashi et al. | |
| 2012/0295107 A1* | 11/2012 | Lee | B32B 9/00 428/367 |
| 2012/0320492 A1 | 12/2012 | Radivojevic et al. | |
| 2012/0321953 A1* | 12/2012 | Chen | B82Y 30/00 429/219 |
| 2012/0325296 A1 | 12/2012 | Woo et al. | |
| 2013/0011736 A1 | 1/2013 | Loveness et al. | |
| 2013/0048339 A1* | 2/2013 | Tour | H01B 1/04 174/126.1 |
| 2013/0082241 A1* | 4/2013 | Kub | H01L 27/148 257/21 |
| 2013/0088699 A1* | 4/2013 | Yakunin | B82Y 10/00 355/67 |
| 2013/0102084 A1* | 4/2013 | Loh | B01J 21/185 436/94 |
| 2013/0130020 A1* | 5/2013 | Kim | H01B 1/22 428/336 |
| 2013/0146846 A1 | 6/2013 | Adkisson et al. | |
| 2013/0171502 A1* | 7/2013 | Chen | H01G 11/06 429/149 |
| 2013/0202945 A1* | 8/2013 | Zhamu | B82Y 30/00 429/156 |
| 2013/0216894 A1* | 8/2013 | Wang | H01M 4/13 429/158 |
| 2013/0224603 A1* | 8/2013 | Chen | B82Y 30/00 429/322 |
| 2013/0255764 A1* | 10/2013 | Naito | H01L 31/022425 136/256 |
| 2013/0295384 A1* | 11/2013 | Ma | B82Y 30/00 428/368 |
| 2013/0302697 A1* | 11/2013 | Wang | B82Y 30/00 429/300 |
| 2013/0319870 A1* | 12/2013 | Chen | H01M 4/133 205/86 |
| 2013/0330611 A1* | 12/2013 | Chen | B82Y 30/00 429/211 |
| 2014/0014970 A1* | 1/2014 | Woo | H01L 21/02527 257/77 |
| 2014/0018480 A1* | 1/2014 | Lee | C08K 5/20 524/235 |
| 2014/0030590 A1* | 1/2014 | Wang | H01B 1/04 429/211 |
| 2014/0072871 A1* | 3/2014 | Chen | H01M 4/36 429/213 |
| 2014/0087251 A1* | 3/2014 | Takahashi | H01M 4/62 429/211 |
| 2014/0098458 A1* | 4/2014 | Almadhoun | C08K 9/02 361/305 |
| 2014/0120399 A1* | 5/2014 | Balandin | H01M 2/1016 429/120 |
| 2014/0127567 A1* | 5/2014 | Kuriki | H01G 11/42 429/211 |
| 2014/0141223 A1* | 5/2014 | Yoda | B32B 27/18 428/216 |
| 2014/0145170 A1* | 5/2014 | Li | C01B 31/0484 257/40 |
| 2014/0209168 A1* | 7/2014 | Zhamu | H01L 31/052 136/259 |
| 2014/0224466 A1* | 8/2014 | Lin | B82Y 30/00 165/185 |
| 2014/0227548 A1* | 8/2014 | Myrick | C06B 45/30 428/570 |
| 2014/0231718 A1* | 8/2014 | Lin | H01B 1/04 252/503 |
| 2014/0235123 A1* | 8/2014 | Lin | G06F 3/041 442/1 |
| 2014/0272172 A1* | 9/2014 | Zhamu | C23C 16/26 427/457 |
| 2014/0272199 A1* | 9/2014 | Lin | H01L 51/444 427/600 |
| 2014/0295179 A1* | 10/2014 | Naito | B82Y 10/00 428/339 |
| 2014/0313562 A1* | 10/2014 | Ruoff | G02F 1/155 359/265 |
| 2014/0315100 A1* | 10/2014 | Wang | H01M 4/366 429/319 |
| 2014/0335312 A1* | 11/2014 | Suh | G02F 1/1343 428/143 |
| 2014/0377159 A1* | 12/2014 | Howard | C01B 31/0415 423/448 |
| 2015/0064574 A1* | 3/2015 | He | H01M 10/0568 429/300 |
| 2015/0064628 A1 | 3/2015 | Guo | |
| 2015/0155430 A1 | 6/2015 | Li | |
| 2015/0168747 A1 | 6/2015 | Kadono et al. | |
| 2015/0025725 A1 | 9/2015 | Naito et al. | |
| 2015/0257258 A1* | 9/2015 | Naito | H01L 33/486 257/99 |
| 2015/0262724 A1 | 9/2015 | Naito | |
| 2015/0262747 A1 | 9/2015 | Oberle | |
| 2015/0279506 A1* | 10/2015 | Wolfrum | C01B 31/0469 252/510 |
| 2015/0280207 A1 | 10/2015 | Chung et al. | |
| 2015/0359065 A1 | 12/2015 | Park et al. | |
| 2015/0364227 A1* | 12/2015 | Tai | H01B 1/08 428/221 |
| 2016/0027935 A1* | 1/2016 | Naito | H01L 31/022425 438/98 |
| 2016/0077090 A1* | 3/2016 | Biris | G01N 21/658 435/5 |
| 2016/0189821 A1* | 6/2016 | Yoon | C01B 31/0453 156/238 |
| 2016/0194474 A1* | 7/2016 | Hasegawa | H01M 4/587 524/584 |
| 2016/0211434 A1* | 7/2016 | Kano | B82Y 30/00 |
| 2016/0268061 A1* | 9/2016 | Wang | C01G 45/02 |
| 2016/0280980 A1* | 9/2016 | Sjong | C09K 5/14 |
| 2016/0293286 A1 | 10/2016 | Sohn et al. | |
| 2016/0326419 A1* | 11/2016 | Balandin | C08K 3/04 |
| 2016/0339160 A1* | 11/2016 | Bedworth | A61M 1/1623 |
| 2016/0359144 A1 | 12/2016 | Li | |
| 2016/0365361 A1 | 12/2016 | Jiang | |
| 2017/0015483 A1* | 1/2017 | Park | C01B 31/00 |

(56) References Cited

U.S. PATENT DOCUMENTS

2017/0057827 A1* 3/2017 Sultana ............... C01B 31/0484
2017/0273181 A1   9/2017 Sohn et al.

FOREIGN PATENT DOCUMENTS

| | | | |
|---|---|---|---|
| JP | 2014203929 | A | 10/2014 |
| JP | 5737405 | B2 | 6/2015 |
| KR | 101106629 | B1 | 1/2012 |
| KR | 101148450 | B1 | 5/2012 |
| KR | 1020130006868 | A | 1/2013 |
| KR | 101284535 | B1 | 7/2013 |
| KR | 1020140054553 | A | 5/2014 |
| KR | 1020140075502 | A | 6/2014 |
| KR | 1020140117894 | A | 10/2014 |
| KR | 101479811 | B1 | 12/2014 |
| KR | 101529382 | B1 | 6/2015 |
| KR | 1020150078508 | A | 7/2015 |
| KR | 1020150116238 | A | 10/2015 |
| WO | 20140169853 | A1 | 5/2014 |
| WO | 2015041388 | A1 | 3/2015 |

OTHER PUBLICATIONS

Liu et al., "Doped graphene nanohole arrays for flexible transparent conductors", Applied Physics Letters, 99, 2011, 023111.

* cited by examiner

CONDUCTIVE COMPONENT AND ELECTRONIC DEVICE INCLUDING THE SAME

CROSS-REFERENCE TO RELATED APPLICATION

This application claims priority to and the benefit of Korean Patent Application No. 10-2015-0185256, filed in the Korean Intellectual Property Office on Dec. 23, 2015, and all the benefits accruing therefrom under 35 U.S.C. § 119, the entire contents of which are incorporated herein by reference.

BACKGROUND OF THE INVENTION (a) Field of the Invention

This disclosure relates to a conductive component and an electronic device including the same.

(b) Description of the Related Art

Electronic devices having a flat panel display, such as an LCD, an OLED, or an LED display, or a touch screen panel, a solar cell, or a transparent transistor include conductive components such as a transparent electrode and the like. A material for the transparent electrode may, for example, desirably have high light transmittance of 80% or more and low electrical resistivity of $10^{-4}$ from or less in the visible frequency range. As currently used oxide materials, there are indium tin oxide (ITO), tin oxide ($SnO_2$), and zinc oxide (ZnO). ITO, which is widely used as a transparent electrode material, is a degenerate semiconductor having a wide band gap of about 3.75 eV, and is easily manufactured by a sputtering process to have a large area.

However, in terms of application for a flexible touch panel or a UD level high resolution display, the ITO has poor conductivity and flexibility and has a cost concern because of limited reserves of indium, so many attempts have been made to replace it.

Recently, a flexible electronic device has been receiving attention as a next generation electronic device. Accordingly, in addition to the aforementioned materials for the transparent electrode, there remains a need for a material which is flexible, transparent, and relatively conductive. Herein, the flexible electronic device includes a bendable or foldable electronic device.

SUMMARY OF THE INVENTION

An exemplary embodiment provides a conductive component with excellent electrical conductivity and reliability as well as improved light transmittance and mechanical flexibility.

Another exemplary embodiment provides an electronic device including the conductive component.

According to an exemplary embodiment, a conductive component is provided, including: a substrate; a first layer including a plurality of island structures disposed on the substrate, wherein the island structures include graphene; and a second layer disposed on the first layer, wherein the second layer includes a plurality of conductive nanowires.

If a maximum length connecting any two points of the island structure and positioned on a surface parallel to the substrate is a first length, the first length may be about 0.05 micrometers (μm) to about 100 μm.

If a maximum length of a perpendicular line extending from any single point of the island structures and positioned on a surface perpendicular to the substrate to a top surface of the substrate is a second length, the second length may be greater than 0 nm and less than or equal to about 1.05 nm.

The first layer may include a dopant that is doped in the island structures.

The dopant may include a metal halide, a nitrogen-containing compound, a sulfur oxide, a metal peroxide, or a combination thereof.

The metal halide may include $AuCl_3$, $FeCl_3$, $MoCl_5$, $WCl_5$, $SnCl_4$, $MoF_5$, $RuF_5$, $TaBr_5$, $SnI_4$, $HAuCl_4$, or a combination thereof.

The nitrogen-containing compound may include $HNO_3$, $AgNO_3$, $NO_2F$, $NO_2Cl$, $N_2O_5$, $NO_2BF_4$, $CH_3NO_2$, $NO(SbCl_6)$, $NOBF_4$, $NOClO_4$, $NOSO_4H$, $NOCl$, $NOF$, $NOB$, or a combination thereof r.

The nitrogen-containing compound may include a substituted or unsubstituted pyrrole, imidazole, pyrazole, pyridine, pyrazine, pyrimidine, pyridazine, indole, quinoline, benzoquinoline, benzimidazole, triazine, carbazole, or a combination thereof.

Light transmittance of the first layer may be 99% or more.

A sheet resistance of the conductive component may be about 20 o ohms per square (ohm/sq) to about 100 ohm/sq.

A haze of the conductive component may be less than 1.5%.

The second layer may include a nanowire mesh structure in which the conductive nanowires are tangled together.

The conductive component may further include an overcoat layer that is formed to cover at least a top surface of the second layer.

The overcoat layer may pass through the second and first layers and may be connected to the substrate.

The conductive nanowire may include silver (Ag), copper (Cu), gold (Au), aluminum (Al), nickel (Ni), cobalt (Co), palladium (Pd), or a combination thereof.

The conductive component can be a transparent electrode, a flexible transparent electrode, a transparent sensor, or a flexible transparent sensor.

According to another exemplary embodiment, an electronic device including the conductive component is provided.

The electronic device may be a flat panel display, a curved display, a touch screen panel, a solar cell, an e-window, an electrochromic mirror, a heat mirror, a transparent transistor, a flexible display, a flexible touch screen panel, a flexible solar cell, a flexible e-window, a flexible electrochromic mirror, or a flexible heat mirror.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION OF THE EMBODIMENTS

Figure 1:
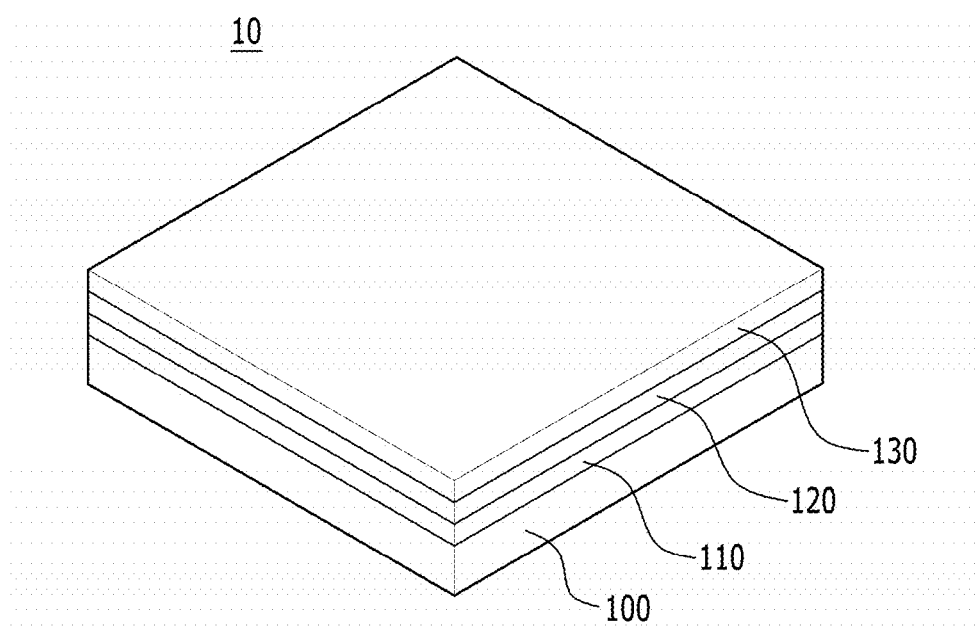
FIG. 1 is a schematic view of a structure of a conductive component according to an exemplary embodiment.

The advantages and features of the present invention and the methods for accomplishing the same will be apparent from the exemplary embodiments described hereinafter with reference to the accompanying drawings. However, the present invention is not limited to the exemplary embodiments described hereinafter, and may be embodied in many different forms. The following exemplary embodiments are provided to make the disclosure of the present invention complete and to allow those skilled in the art to clearly understand the scope of the present invention, and the present invention is defined only by the scope of the appended claims. In some exemplary embodiments, detailed description of well-known technologies will be omitted to prevent the disclosure of the present invention from being obscured.

Unless otherwise defined, all terms (including technical and scientific terms) used herein have the same meaning as commonly understood by one of ordinary skill in the art. The terms defined in a generally-used dictionary are not to be interpreted ideally or exaggeratedly unless clearly defined otherwise.

Throughout the specification, unless explicitly described to the contrary, the word "comprise" and variations such as "comprises" or "comprising" will be understood to imply the inclusion of stated elements but not the exclusion of any other elements.

Further, the singular includes the plural unless mentioned otherwise.

In the drawings, the thickness of layers, regions, etc. are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

A schematic structure of a conductive component 10 according to an exemplary embodiment will now be further described with reference to FIG. 1.

FIG. 1 illustrates a schematic view of a structure of a conductive component according to an exemplary embodiment. Referring to FIG. 1, the conductive component 10 according to an exemplary embodiment comprises a laminated body including: a substrate 100; a first layer 110 disposed on, e.g., formed on, the substrate 100 and comprising graphene or a derivative thereof (for convenience, hereinafter collectively referred to as graphene); a second layer 120 disposing, e.g., formed on, the first layer 110 and including a conductive nanowire; and an overcoat layer 130 disposed on, e.g., formed on, to at least cover a top surface of the second layer 120.

The conductive component 10 may, as shown in FIG. 1, have a structure in which the first layer 110 is disposed on the substrate 100 and the second layer 120 is disposed at least directly on the first layer 110. That is, the conductive component 10 according to an exemplary embodiment may have the structure in which the first layer 110, which may comprise different kinds of conductors, e.g., graphene and conductive nanowires, and the second layer 120 are sequentially laminated and hybridized on the substrate 100.

The substrate 100 may be a transparent substrate. A material of the substrate 100 is not specifically limited, and it may be a glass substrate, a semiconductor substrate, a polymer substrate, or a combination thereof, or may be a substrate on which an insulating layer and/or a conductive layer are laminated. For example, the substrate 100 may include an inorganic material such as an oxide glass, a polyester such as polyethylene terephthalate, polybutylene terephthalate, or polyethylene naphthalate, a polycarbonate, an acryl-based resin such as acrylic, a cellulose or a derivative thereof, a polymer such as a polyimide, or an organic/inorganic hybrid material, or a combination thereof.

A thickness of the substrate 100 is not specifically limited, and may be appropriately selected depending on kinds of the final product. For example, the thickness of the substrate 100 may be equal to or greater than about 0.5 micrometer (μm), and for example, may be equal to or greater than about 1 μm or about 10 μm, but it is not limited thereto. The thickness of the substrate 100 may be less than or equal to about 1 mm, e.g., less than or equal to about 500 μm or about 200 μm, but it is not limited thereto. An additional layer (e.g., an undercoat layer) may be provided between the substrate 100 and the conductive layer if desired (e.g., in order to adjust a refractive index of transmitted light). In addition, an adhesive layer (not shown) may be further provided to increase an adhesive strength with respect to the first layer 110.

Figure 2A:
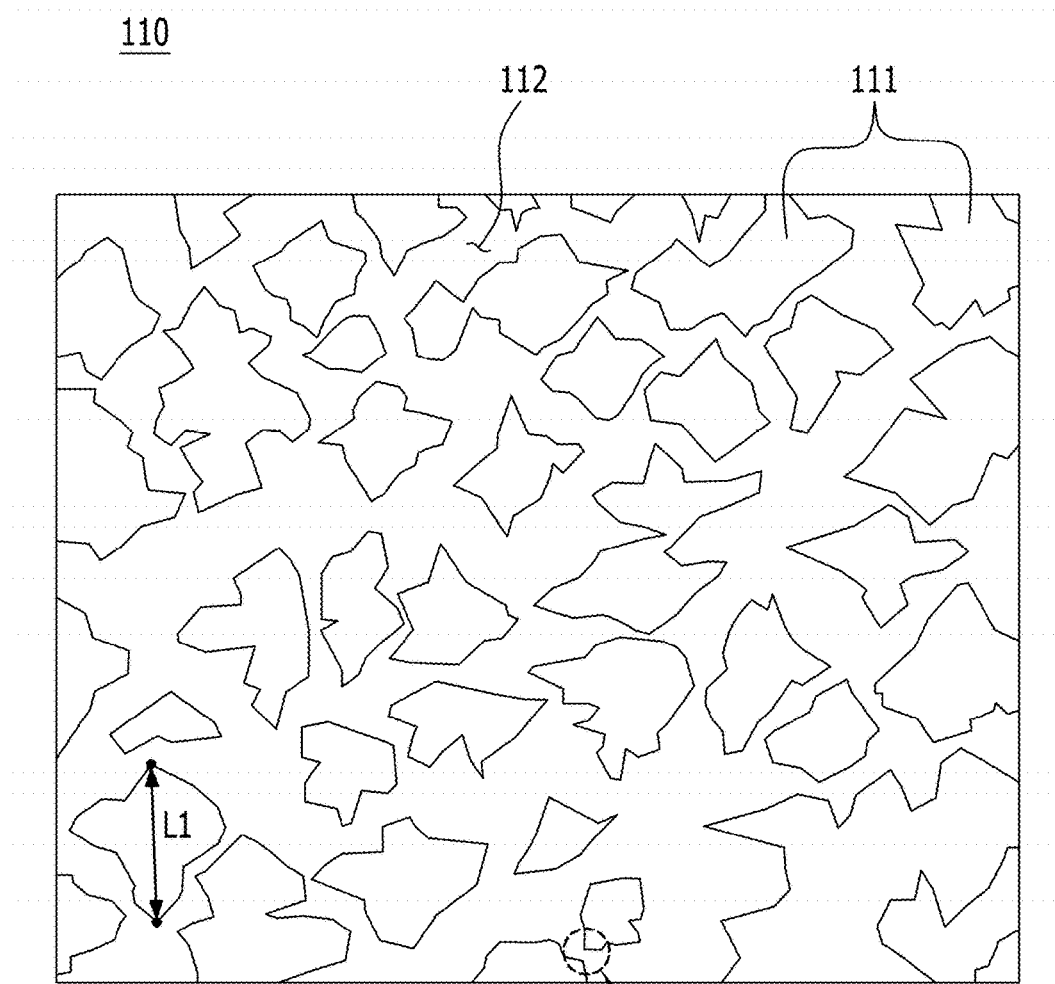
FIG. 2A shows a first layer of the conductive component according to an exemplary embodiment.
Figure 2B:
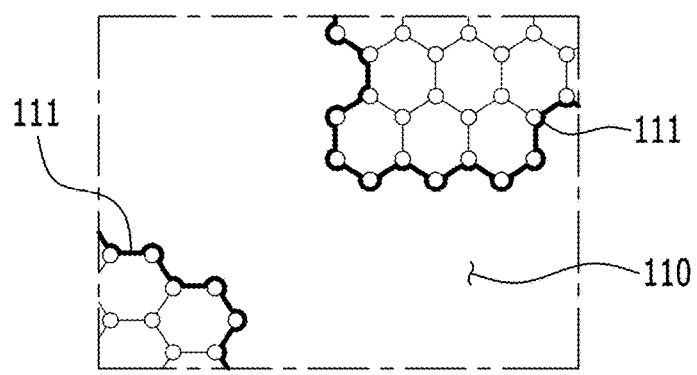
FIG. 2B shows an enlarged view of the indicated portion in FIG. 2A.

FIG. 2 illustrates the first layer of the conductive component according to an exemplary embodiment.

Referring to FIGS. 1 and 2, the first layer 110 may be disposed on, e.g., formed on, the substrate 100, and may comprise graphene or a derivative thereof (hereinafter referred to as graphene). In an exemplary embodiment, the first layer 110 may be formed directly on the substrate 100, or may be disposed to face the substrate 100 while interposing an adhesive layer such as an optical clear adhesive (OCA) therebetween. In an exemplary embodiment, since graphene, which has excellent adhesive strength with respect to the substrate 100, may be disposed on the first layer 110, the first layer 110 is suppressed from being lifted or separated from the substrate 100 even if the conductive component 10 is bent or folded.

The first layer 110 of the conductive component 10 according to an exemplary embodiment may be formed as two or more scattered island structures 111. That is, the first layer 110 may, as shown in FIG. 2, may be divided into a region filled with two or more island structures 111, and a remaining region 112, hereinafter referred to as an opening region, in which a space filled with the island structures 111 is excluded.

The island structures 111 of the first layer 110 may block or absorb transmitted light. That is, the island structures 111 may cause haze of the first layer 110 to increase.

However, since the transmitted light may directly pass through the opening region 112 of the first layer 110, overall light transmittance of the first layer 110 may increase in proportion to a size of the opening region 112, and the light transmittance of the first layer 110 may, for example, be adjusted to 99% or more.

For example, a graphene sheet without the opening region 112 as in an exemplary embodiment shows light transmittance of about 95% to about 97%, and thus there remains a need for a material having improved optical characteristics. However, according to an exemplary embodiment, since the first layer 110 includes a structure with the island structures 111 made of graphene and the opening region 112, rather than a structure in which a graphene sheet covers the entire substrate, to allow a top surface of the substrate 100 to be partially opened, the light transmittance can be adjusted within the range, and accordingly, the conductive component 10 having improved optical characteristics can be provided.

On the other hand, the island structures 111 may be formed by appropriately controlling growth conditions of graphene during a forming process of graphene to be further described later.

When viewed from above the substrate 100, the island structures 111 may have a polygonal, circular, or oval shape, or may have an atypical, i.e., irregular shape. In an embodiment, the island structures 111 may be formed to have various shapes as illustrated in FIG. 2.

The island structure 111 as described above may, as shown in FIG. 2, be a structure that consists of graphene having a single layer or a body comprising 10 or fewer graphene layers, e.g., 2 to 8 graphene layers. A plurality of island structures 111 may be disposed on the first layer 110, or a plurality of small island structures may be grouped together to form one large island structure.

In an exemplary embodiment, a maximum length connecting any two points of the island structure 111 and positioned on a surface parallel to the substrate 100 is defined as a first length L1. The first length L1 may be called differently depending on shapes of the island structure 111, for example, it may be called a diameter if the island structure 111 has a circular shape, a long axis if the island structure has an oval or polygonal shape, and a farthest distance connecting any two points if the island structure has an atypical shape.

For example, the first length L1 may be about 0.05 μm to about 100 μm, about 0.1 μm to about 75 μm, or about 1 μm to about 50 μm. That is, the island structure 111 may have various sizes that range from tens of nanometers to hundreds of micrometers.

The first length L1 may show a distribution of the relatively wide range as described above due to differences in growth speeds of graphene at each point, the different island structures being connected together to form one large island structure, or the like.

However, when the first length L1 is less than about 0.05 μm, electrical conductivity of the first layer 110 and conductive nanowires to be described below may be significantly decreased by repeated stress such as repeated bending, folding, or the like, thereby deteriorating reliability of the conductive component 10.

When the first length L1 is equal to or greater than about 100 μm, since a ratio of the opening region 11 to the first layer 110 is reduced and thus haze of the first layer 110 is increased, light transmission characteristics of the conductive component 10 may be deteriorated.

Figure 3:
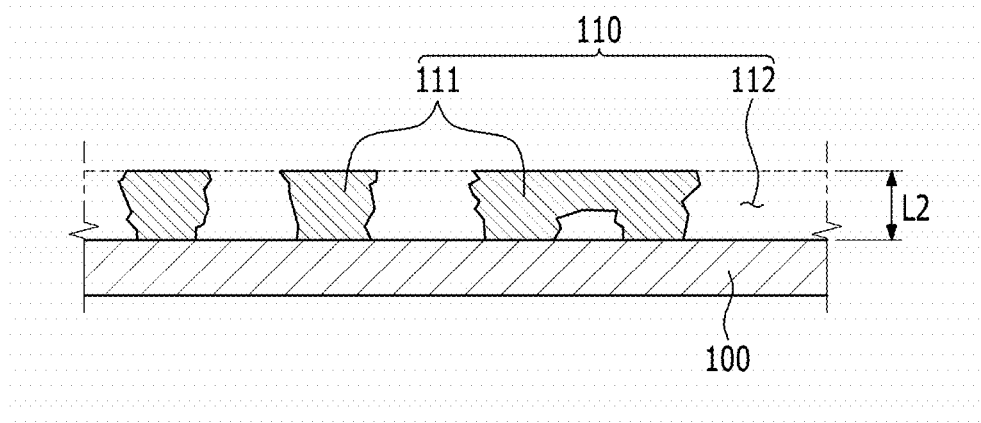
FIG. 3 illustrates an example of island structures of the conductive component that are formed on a substrate according to an exemplary embodiment.

FIG. 3 illustrates one example of the island structures of the conductive component of an exemplary embodiment that are formed on a substrate.

In an exemplary embodiment, a maximum length of a perpendicular line extending from any one point of the island structure 111 to the top surface of the substrate 100, wherein the line is perpendicular to the substrate 100, is defined as a second length. The second length may also be called a maximum height of the island structure 111. The plurality of island structures island structures 111 may, as shown in FIG. 3, be controlled such that they have a structure in which graphene grows two-dimensionally with the same second length L2.

In an exemplary embodiment, the second length may, for example, be greater than about 0 nm and less than or equal to about 1.5 nm, for example, greater than about 0 nm and less than or equal to about 1.1 nm, and for example, greater than about 0 nm and less than or equal to about 1.05 nm. That is, the island structures 111 may be formed as a graphene monolayer, or may be formed to have about three or fewer graphene layers, such as 1 or 2 graphene layers. When the second length is equal to or greater than 1.05 nm, light transmission characteristics of the conductive component 10 may be deteriorated as the haze of the first layer 110 increases.

The first layer 110 comprises graphene, which may be undoped or doped. The dopant can be included in the graphene of the island structure 111 to improve sheet resistance characteristics of the conductive component 10.

In an exemplary embodiment, the type of dopant is not specifically limited, and for example, may include a metal halide, a nitrogen oxide, a sulfur oxide, a halogen oxide, a metal peroxide, or a combination thereof.

The metal halide, nitrogen oxide, sulfur oxide, and metal peroxide are materials that are suitable for doping a p-type dopant, and may improve electrical conductivity of the island structures 111 that are made of graphene. The metal halide may be a metal salt including gold ions, silver ions, iron ions, tungsten ions, molybdenum ions, or a combination thereof. For example, the metal halide may comprise $AuCl_3$, $FeCl_3$, $MoCl_5$, $WCl_5$, $SnCl_4$, $MoF_5$, $RuF_5$, $TaBr_5$, $SnI_4$, $HAuCl_4$, or a combination thereof.

The nitrogen oxide may comprise $HNO_3$, $AgNO_3$, $NO_2F$, $NO_2Cl$, $N_2O_5$, $NO_2BF_4$, $CH_3NO_2$, $C_6H_5NO_2$, $CH_3ONO$, $NO(SbCl_6)$, $NOBF_4$, $NOClO_4$, $NOSO_4H$, $NOCl$, $NOF$, $NOBr$, or combination thereof.

Alternatively, the nitrogen oxide may also comprise a $C_2$ to $C_{60}$ heteroaryl group which is substituted or unsubstituted by a pyrrole, imidazole, pyrazole, pyridine, pyrazine, pyrimidine, pyridazine, indole, quinoline, benzoquinoline, benzimidazole, triazine, or carbazole; deuterium, a halogen atom, a methyl group, an ethyl group, an n-propyl group, an i-propyl group, an n-butyl group, an i-butyl group, a t-butyl group, or a combination thereof.

The heteroaryl group may comprise a pyrrole, imidazole, pyrazole, pyridine, pyrazine, pyrimidine, pyridazine, indole, quinoline, benzoquinoline, benzimidazole, triazine, carbazole, or a combination thereof.

The sulfur oxide may comprise $CH_{32}SO$, $KHSO_5$, $KHSO_4$, $K_2SO_4$, $FSO_3H$, $CF_3SO_3H$, or a combination thereof.

The metal peroxide may comprise $KMnO_4$, $BaMnO_4$, $OsO_4$, or a combination thereof.

The dopant may be doped directly on the surface of the island structure 111, or a polymer layer including a polymer and the dopant may be coated directly on or directly beneath the island structure 111 using a roll-to-roll method or the like.

The content of the dopant may be variously adjusted depending on the kind of the dopant, and may, for example, be contained in amount of about 0.01 wt % to about 10 wt %, about 0.1 wt % to about 8 wt %, based on a the total weight of the first layer. In an exemplary embodiment, when the content of the dopant is within the foregoing range, electrical conductivity of the island structure 111 may be improved, and simultaneously, light transmittance of the first layer 110 may be maintained at 99% or more.

In an exemplary embodiment, a content of a carrier, such as electrons or holes, may increase to cause the Fermi level to decrease since the dopant is further doped to the island structures 111, thereby improving electrical conductivity of the graphene forming the island structures 111.

As such, in the conductive component 10 according to an exemplary embodiment, since the first layer 110 may be formed to have a structure including the island structures 111 and the opening region 112 rather than only a graphene sheet, the light transmittance of the first layer 110 may be improved, and the electrical conductivity of the first layer 110 may be significantly improved by additionally doping the dopant without detriment to light transmittance, thereby allowing the conductive component 10 to have high light transmittance and electrical conductivity.

Figure 4:
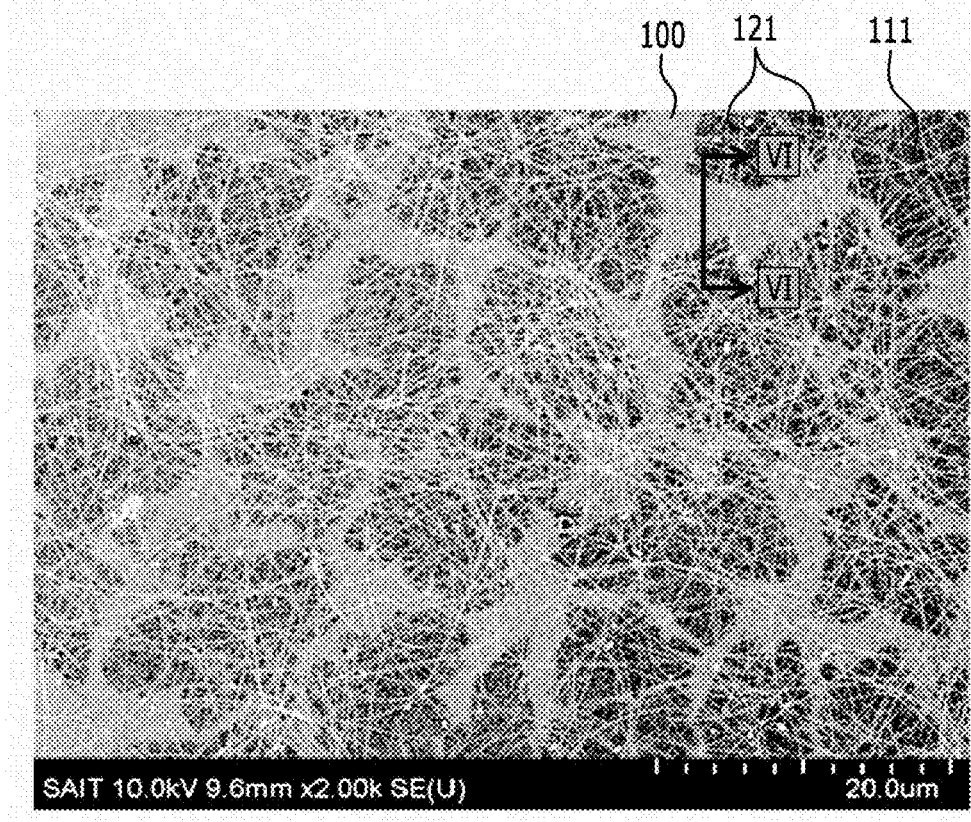
FIG. 4 illustrates the conductive component according to an exemplary embodiment as seen from above.

FIG. 4 illustrates the conductive component according to an exemplary embodiment as seen from above, which further highlights a state where the first layer and the second layer overlap each other.

The top surface of the second layer 120 may be covered by the overcoat layer 130 as illustrated in FIG. 1, and the overcoat layer 130 may comprise a transparent material and thus is not distinguishable from the first and second layers 110 and 120 with the naked eye, so a description of the overcoat layer 130 will be omitted when describing FIG. 4.

In FIG. 4, the island structures 111 are marked as dark regions, and bright regions in which the dark regions are excluded are opened by the aforementioned opening region to partially expose a top surface of the substrate 100.

Referring to FIGS. 1 and 4, the second layer 120 may include a plurality of conductive nanowires 121, and may be disposed on the first layer 110. The conductive nanowires 121 may contact each other inside the second layer 120 to provide electrical connection therebetween. In addition, the conductive nanowires 121 contacting each other may be tangled together to form a mesh-like structure, thereby exhibiting further improved electrical conductivity.

Figure 5:
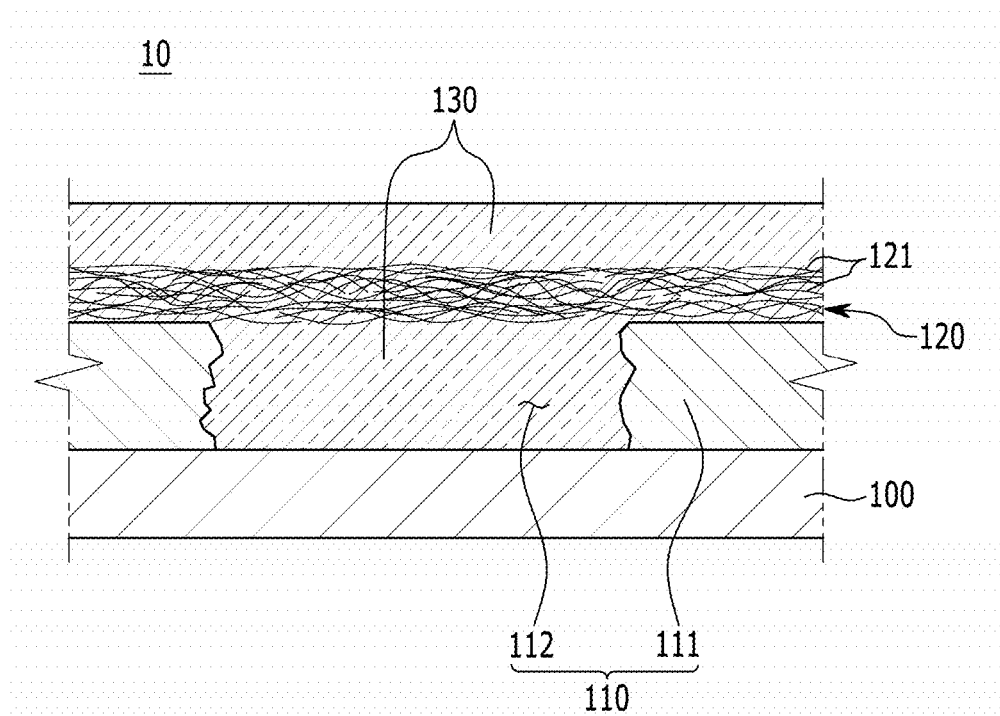
FIG. 5 is a cross-sectional view of FIG. 4 taken along line VI-VI.

That is, the formed second layer 120 may, as shown in FIG. 5, include a nanowire mesh structure in which a plurality of conductive nanowires 121 are tangled together.

The nanowire mesh structure includes a space in which the nanowires 121 are tangled together, and pores in which the conductive nanowires 121 are not positioned. In an exemplary embodiment, the conductive nanowires 121 may, as shown in FIG. 4, not be oriented in a specific direction, and may be randomly tangled to form a nanowire mesh structure.

The conductive nanowire 121 may comprise a material having metallic conductivity, and may, for example, include silver (Ag), copper (Cu), gold (Au), aluminum (Al), cobalt (Co), palladium (Pd), or a combination thereof. In an embodiment, the conductive nanowire 121 comprises an alloy comprising silver (Ag), copper (Cu), gold (Au), aluminum (Al), cobalt (Co), palladium (Pd), or a combination thereof. Also, the conductive nanowire 121 may comprise a plurality of segments, wherein a composition of each segment may be independently selected. For example, the conductive metal nanowire may be a silver (Ag) nanowire.

The conductive nanowire 121 may have an average diameter of less than or equal to about 100 nm, for example, less than or equal to about 30 nm, and for example, less than or equal to about 20 nm, or about 1 nm to about 100 nm, or about 5 nm to about 50 nm. A length of the conductive nanowire 121 is not specifically limited, and may be appropriately selected depending on the diameter. For example, the length of the conductive nanowire 121 may be equal to or greater than about 10 µm, for example, equal to or greater than about 20 µm, and for example, equal to or greater than 30 µm, but it is not limited thereto, and may be about 1 µm to about 1000 µm, or about 10 µm to about 500 µm.

The conductive nanowire 121 may be manufactured by any suitable method, and may be procured commercially. A polymer coating, such as a polyvinylpyrrolidone coating may be formed on a surface of the conductive nanowire 121.

The second layer 120 may be formed by any suitable layer forming method, and is not specifically limited. Non-limiting examples of methods to form the second layer 120 include applying a coating composition including the conductive nanowires 121 on the first layer 110 and then removing a solvent. The coating composition may further include an appropriate solvent, e.g., water, or an organic solvent miscible or immiscible with water, and a dispersing agent, e.g., hydroxypropyl methylcellulose (HPMC) or a C2 to C20 organic acid.

For example, the coating composition including the conductive nanowires 121 can be a commercially available composition or may be manufactured by a suitable method, the details which can be determined by one of skill in the art without undue experimentation.

The composition may be coated on the substrate and then dried and/or heat-treated, thereby forming a structure in which the conductive nanowires 121 form a series of layers. Coating the composition may be performed by any suitable method, and for example, may be performed by bar coating, blade coating, slot die coating, spray coating, spin coating, gravure coating, ink jet printing, or a combination thereof.

Also, the second layer 120 may include an organic binder. In order to form the second layer 120 which is a second conductive layer, the binder may serve to appropriately adjust viscosity of the composition, or serve to increase binding strength between the nanowires or adhesive strength with respect to the first layer 110. Non-limiting examples of the binder may include methyl cellulose, ethyl cellulose, hydroxylpropyl methyl cellulose (HPMC), hydroxylpropyl cellulose (HPC), xanthan gum, polyvinyl alcohol (PVA), polyvinylpyrrolidone (PVP), carboxymethyl cellulose, hydroxylethyl cellulose, or a combination thereof. The content of the binder may be appropriately selected, and is not specifically limited. For example, the content of the binder may be 1 to 100 parts by weight, based on 100 parts by weight of the nano-sized conductive components.

Since conductive characteristics of graphene having a layered structure was reported, many efforts for applying graphene as a highly flexible, transparent, and conductive film material which can replace indium tin oxide (ITO) having vulnerable mechanical characteristics have been made. However, it is difficult for graphene to exhibit a satisfactory level of light transmittance since it has a relatively high light absorption coefficient, and it is also difficult to separately laminate and use a thickness corresponding to 4 or more sheets of monolayers.

On the other hand, a flexible conductive component using the conductive nanowire 121 made of a metal has also been under development, but the conductive nanowire 121 has a limitation when being applied as a flexible electrode since it has low elongation at break and thus is broken in a high elongation region.

That is, the conductive nanowire 121 may have low sheet resistance and improved transmittance, but the nanowire is prone to breakage in a high strain region (e.g., 6.7% or more). Graphene may provide improved flexibility, but has a tendency of showing high sheet resistance compared with light transmittance.

However, the conductive component 10 according to an exemplary embodiment may have a structure in which different kinds of conductive layers are laminated and hybridized, since the second layer 120 including the nanowire mesh structure, in which a plurality of conductive nanowires 121 are entangled together to be physically and electrically coupled to each other, is formed on the first layer 110 that includes the plurality of island structures 111 made of graphene.

In an exemplary embodiment, since the first layer 110 has a structure in which the plurality of island structures 111, rather than a general graphene sheet, are scattered, a haze characteristic of the first layer 110 can be improved by the opening region 112, and at the same time, mechanical flexibility associated with flexibility of a graphene material itself can be obtained.

In an exemplary embodiment, a haze of the conductive component 10 may be, for example, less than or equal to about 2%, for example, less than or equal to about 1.8%, for example, less than or equal to about 1.5%, and for example, less than or equal to about 1.2%, or about 0.01% to about 2%, or about 0.1% to about 1%. Since the conductive component 10 of an exemplary embodiment may adjust the light transmittance of the first layer 110 to 99% or more via the opening region 112, and the haze of the entire conductive component 10 may be controlled within the range even if light transmittance of the nanowire mesh structure is considered, the conductive component 10 having excellent optical characteristics can be provided.

Further, in an embodiment, a sheet resistance of the first layer 110 that is inevitably increased by the opening regions 112 may be reduced by forming the second layer 120 including the mesh structure of the conductive nanowires 121 on the first layer 110, thereby improving electrical conductivity of the hybridized conductive component 10.

In an exemplary embodiment, the sheet resistance of the conductive component 10 may be, for example, about 20 ohms per square (ohm/sq) to about 100 ohm/sq, for example, about 20 ohm/sq to about 80 ohm/sq, and for example, about 30 ohm/sq to about 50 ohm/sq. As the sheet resistance of the conductive component 10 is reduced in the range, the conductive component 10 having the excellent electrical conductivity can be provided.

In an embodiment, since the first layer 110 made of graphene is formed directly on the substrate 100, the conductive component 10 which shows excellent adhesive strength with respect to the substrate and has minimally decreased electrical conductivity even in the high strain region (e.g., 6.7% or more) compared with a case in which the conductive nanowires are formed directly on the substrate is provided. That is, the highly reliable conductive component 10 may be provided.

As such, specific physical property improvements (haze characteristic, sheet resistance, light transmittance, and reliability) of the conductive component 10 in which the island structures 111 made of graphene and the mesh structure of the conductive nanowires 121 are hybridized in the exemplary embodiment will be further described below.

FIG. 5 illustrates a cross-sectional view of FIG. 4 taken along line VI-VI.

Referring together to FIGS. 1, 4, and 5, which are further described above, the conductive component 10 according to an exemplary embodiment may include the overcoat layer 130 that is formed on the second layer 120 and that includes a thermosetting resin, an ultraviolet (UV) curable resin, or a combination thereof.

Since the overcoat layer 130 comprises a transparent material, light sequentially transmitted through the substrate 100, the first layer 110, and the second layer 120 is emitted after being transmitted through the overcoat layer 130, or light incident on the overcoat layer 130 may be transmitted toward a direction where the substrate 100 is positioned.

Specific examples of the thermosetting resin and the ultraviolet (UV) curable resin for manufacturing the overcoat layer 130 are commercially available and can be determined by one of skill in the art without undue experimentation. In an exemplary embodiment, the thermosetting resin and the ultraviolet (UV) curable resin for the overcoat layer 130 may be a polymer material including urethane (meth)acrylate, a perfluoropolymer having a (meth)acrylate group, a poly(meth)acrylate having a (meth)acrylate group, an epoxy(meth)acrylate, or a combination thereof.

The overcoat layer 130 may further include an inorganic oxide particulate (e.g., a silica particulate). A method of forming an overcoat layer from the aforementioned materials on the conductive thin film is disclosed, and is not specifically limited.

Referring to FIG. 5, the overcoat layer 130 may pass through the second and first layers 120 and 110 to be connected to the top surface of the substrate 100. That is, in an exemplary embodiment, during a coating process of the overcoat layer 130, the resin penetrates into the first layer 110 via the pores formed in the nanowire mesh structure, and the penetrated resin may be further connected to the top surface of the substrate 100 while filling the opening region 112 formed in the first layer 110.

Generally, although having higher adhesive strength with respect to the substrate than the aforementioned conductive nanowires, graphene may be lifted or separated from the substrate due to chemical stability of graphene itself while it is being processed or as a result of repeated or temporary physical impacts delivered thereto such as bending or the like. In addition, the overcoat layer may be separated from the second layer by physical impact when it does not directly contact the substrate. These factors may deteriorate reliability of the electronic device including the conductive component by increasing sheet resistances of the first and second layers.

However, in an exemplary embodiment, since the overcoat layer 130 is formed not merely on the top surface of the second layer 120 but is also formed to contact the top surface of the substrate 100 while filling spaces between the plurality of nanowires 121 of the second layer 120 and the plurality of opening regions 112 formed in the first layer 110, as shown in FIG. 5, adhesive strength between the overcoat layer 130 and the substrate 100 and between the first layer 110 and the second layer 120 may be improved. That is, according to an exemplary embodiment, the conductive component 10 that can minimize deterioration of electrical conductivity characteristics even if repeated or temporary physical impacts such as bending or the like are delivered can be provided.

On the other hand, in another exemplary embodiment, an electronic device may include the aforementioned conductive component 10.

The electronic device may be a flat panel display, a curved display, a touch screen panel, a solar cell, an e-window, an electrochromic mirror, a heat mirror, a transparent transistor, a flexible display, a flexible touch screen panel, a flexible solar cell, a flexible e-window, a flexible electrochromic mirror, or a flexible heat mirror.

In another exemplary embodiment, the electronic device may be a flexible display. The flexible display refers to an electronic device that is foldable or bendable based on a single axis or multiple axes, and the detailed structure of the flexible display is well-known. The flexible display may be, for example, a flexible organic light emitting diode (OLED)

display including a flexible substrate, a conductive component formed on the substrate, and an organic light emitting material formed on the conductive component.

On the other hand, the electronic device may be a touchscreen panel, and the touch screen panel may have a structure in which a first transparent conductive layer, a first transparent adhesive layer (for example, OCA) film, a second transparent conductive layer, a second transparent adhesive layer, and a window for the display device are sequentially formed on a panel, e.g., on a liquid crystal display panel. The first transparent conductive layer and/or the second transparent conductive layer may be the aforementioned conductive component.

Herein, an example in which the conductive component is applied to the flexible display or the touchscreen panel has been described, but the present invention is not limited to such example.

For example, the conductive component of an exemplary embodiment may be a transparent electrode, a flexible transparent electrode, a transparent sensor, and a flexible transparent sensor inside various electronic devices. For example, the conductive component may be used as electrodes of all electronic devices, and for example, may also be used as a pixel electrode and/or a common electrode of a liquid crystal display (LCD), an anode and/or a cathode of an organic light emitting diode (OLED) display, and a display electrode of a plasma display panel (PDP).

Hereinafter, the detailed embodiments will be presented. The following exemplary embodiments are for describing the present disclosure in further detail and thus shall not be limiting.

EXAMPLES

Manufacture of Exemplary Embodiment 1

A conductive component of Exemplary Embodiment 1 may be manufactured by the following method.

[1] Under a temperature of 1000° C. in a $CH_4$ gas-containing atmosphere, chemical vapor deposition is performed for less than 1 minute (min) using a hydrocarbon precursor supplying carbon atoms at one surface of a copper (Cu) foil to obtain two or more island structures. Each island structure may have a structure in which one or two graphene layers are laminated. In this case, the two or more island structures are disposed to be scattered on the copper foil. Since growth speeds of the graphene are different at each point of the copper foil, the island structures may be formed to have various shapes and sizes as illustrated in FIG. 2.

After a polymethyl methacrylate (hereinafter, PMMA) support layer is formed on the two or more island structures that are deposited, the copper foil is etched and removed. In this case, the island structures formed on the PMMA layer which is the support layer are arranged upside down as compared to when they are formed on the copper foil.

Subsequently, the island structures formed in the PMMA layer are transferred onto a PET substrate and the PMMA layer is then removed, thereby obtaining a laminated body of PET-graphene island structures in which the two or more island structures are formed on the PET substrate. In this case, the island structures formed on the PET substrate may be arranged the same as when they are on the aforementioned copper foil. The island structures, and the opening region indicating spaces separated therebetween, form a first layer which is a first conductive layer.

Light transmittance of the laminated body of the PET-graphene island structure is measured using a light transmittance meter (NDH-7000 SP) manufactured by Nippon Denshoku Industries Co., Ltd., and the results are shown in Table 1.

[2] A Ag nanowire-containing composition having the following components is obtained.

4.32 grams (g) of a Ag nanowire solution (concentration: 0.5 wt %, Ag nanowire average diameter: 20 nm)

Solvent: 7.416 g of water and 4.261 g of ethanol

Binder: 0.864 g of a hydroxylpropyl methyl cellulose solution (concentration: 0.25%)

The Ag nanowire-containing composition is coated using a wired bar directly on the graphene island structures of the laminated body of the PET-graphene island structures, and is then dried for 5 min at a temperature of 100° C. in an air atmosphere, thereby forming a second layer which is a second conductive layer.

[3] A mixture solution is then prepared by mixing 1 g of a urethane acrylate solute with 9 g of a solvent in which diacetone alcohol and isopropyl alcohol are mixed at a ratio of 5:5. Next, using the wired bar, the mixture solution is coated on the second layer and then dried for at least 2 min at room temperature. Subsequently, the obtained resultant material is dried in an oven at 100° C. and is cured by UV curing equipment to form an overcoat layer, thereby obtaining a conductive component in which the substrate, the first layer including the graphene island structures, the second layer including the conductive nanowires, and the overcoat layer are sequentially laminated and hybridized.

The manufactured conductive component has an internal structure as illustrated in FIG. 5 as a result of some of the mixture solution penetrating through the second and first layers during the forming of the overcoat layer to contact a top surface of the substrate and then being dried and cured.

[4] Next, light transmittance of the conductive component is measured using a light transmittance meter (NDH-7000 SP) manufactured by Nippon Denshoku Industries Co., Ltd., and haze of the conductive component is calculated by the light transmittance and is shown in Table 1.

TABLE 1

| Light transmittance of first layer | Light transmittance of conductive component | Haze of conductive component |
| --- | --- | --- |
| 99.0% | 90.3% | 1.1% |

Referring to Table 1, it can be seen that light transmittance of the first layer is 99.0% which is superior to light transmittance of 95% to 97% of a graphene sheet, that overall light transmittance of the conductive component is 90.3%, which is excellent, and that haze is merely 1.1%. That is, referring to Table 1, it can be seen that optical characteristics of the first layer including the graphene island structures and the conductive component are improved.

Using MITSUBISHI Loresta-GP (MCP-T610) or ESP-type probes (MCP-TP08P), sheet resistance of the conductive component is measured 7 times, and the results are shown in Table 2.

TABLE 2

| No. of measurements | Sheet resistance of conductive component |
| --- | --- |
| 1 | 29 ohm/sq |
| 2 | 30 ohm/sq |
| 3 | 30 ohm/sq |

TABLE 2-continued

| No. of measurements | Sheet resistance of conductive component |
|---|---|
| 4 | 28 ohm/sq |
| 5 | 31 ohm/sq |
| 6 | 29 ohm/sq |
| 7 | 31 ohm/sq |

Referring to Table 2, it can be seen that the conductive component has improved electrical conductivity since it exhibits overall sheet resistance of 30 ohm/sq to 50 ohm/sq. It is difficult to directly measure the sheet resistance of the first layer since two or more island graphene structures are disposed to be scattered with respect to each other, but it is natural that the sheet resistance of the first layer is increased by the opening region of the first layer as compared to that of the general graphene sheet. However, it can be seen that since the island graphene and the Ag nanowire mesh structures are hybridized in the exemplary embodiment, the sheet resistance characteristics are further improved as shown in Table 2 as compared to the structure of the graphene sheet or the structure in which the graphene sheet and nanowires are hybridized.

Manufacture of Comparative Example

An Ag nanowire-containing composition identical to that of Exemplary Embodiment 1 described above is coated on a PET substrate using a wired bar, and is then dried for 5 min at a temperature of 100° C. in an air atmosphere, such that a second layer is formed first as a second conductive layer. Accordingly, a laminated body of PET-Ag nanowire mesh structures in which Ag nanowire mesh structures are formed on a PET substrate may be obtained.

[2] Island structures are formed on a copper foil by the same method as in Exemplary Embodiment 1 described above, a polymethyl methacrylate (hereinafter, PMMA) support layer is formed on the formed graphene island structures and the copper foil is then etched and removed, and the graphene island structures formed on the PMMA layer is transferred directly onto Ag nanowire mesh structures of PET-Ag nanowire mesh structures and the PMMA layer is then removed, thereby forming the graphene island structures directly on the Ag nanowire mesh structures.

Next, under the same conditions as those in Exemplary Embodiment 1 described above, an overcoat layer is formed on the graphene island structures, the substrate, thereby obtaining a conductive component in which the second layer including conductive nanowires, the first layer including the graphene island structures, and the overcoat layer are sequentially laminated and hybridized.

Next, the following reliability evaluation is performed for Exemplary Embodiment 1 and the comparative example.
Reliability Evaluation

[1] Reliability evaluation is used for evaluating overall physical properties of the conductive component. First, after resistances in a low strain region (2.6% or less) and in a high strain region (6.7% or more) where Ag nanowires can be destroyed are respectively measured, a resistance change ratio is checked in each region.

[2] A cyclic bending tester is adjusted to press and bend the conductive components of Exemplary Embodiment 1 and the comparative example such that strain of 2.6% is applied to the conductive components. In this case, resistances of the conductive components of Exemplary Embodiment 1 and the comparative example are measured and recorded by the cyclic bending tester using a 2-point probe method.

Next, a process of repeatedly bending the conductive components 20,000 times is performed and the resistances of the conductive components of Exemplary Embodiment 1 and the comparative example are measured by the cyclic bending tester and are compared with the recorded initial resistances to calculate the resistance change ratios of the Exemplary Embodiment and the comparative example, and the results are shown in Table 3.

The resistance change ratio may be calculated by the following Equation 1.

Resistance change ratio [%]=(resistance after bending 20,000 times−initial resistance)/initial resistance×100%      Equation 1

[3] After the experiment is performed once more under the same conditions as the aforementioned conditions, except the fact that they are bent to achieve strain of 6.7%, resistance change ratios of Exemplary Embodiment 1 and the comparative example are calculated, and the results are shown in Table 3.

Figure 6:
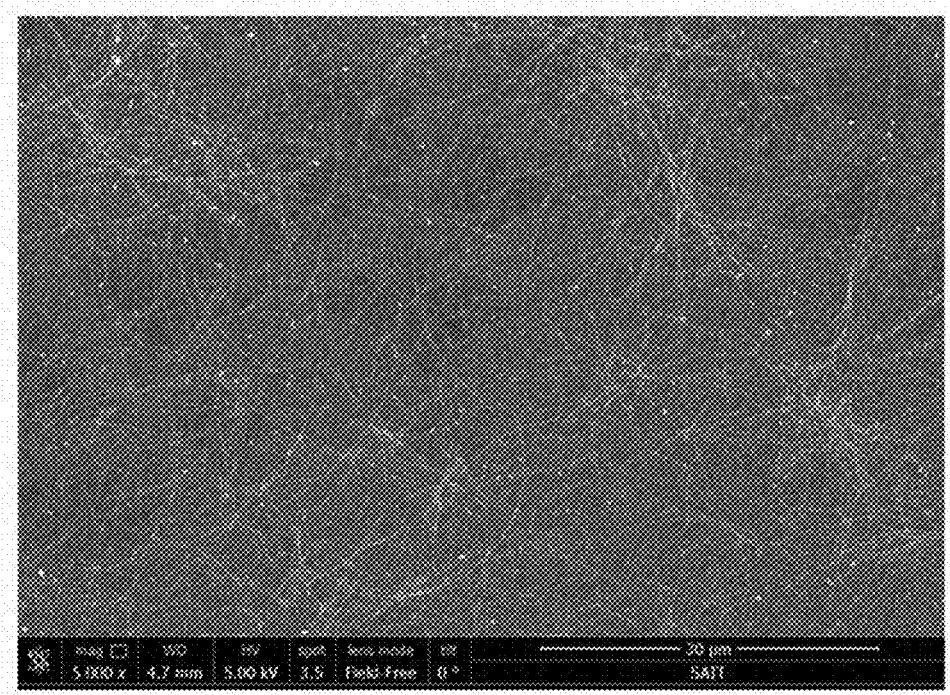
FIGS. 6 and 7 are photographs of the conductive component after it is bent in a high strain region, and illustrate an exemplary embodiment and a Comparative Example, respectively.
Figure 7:
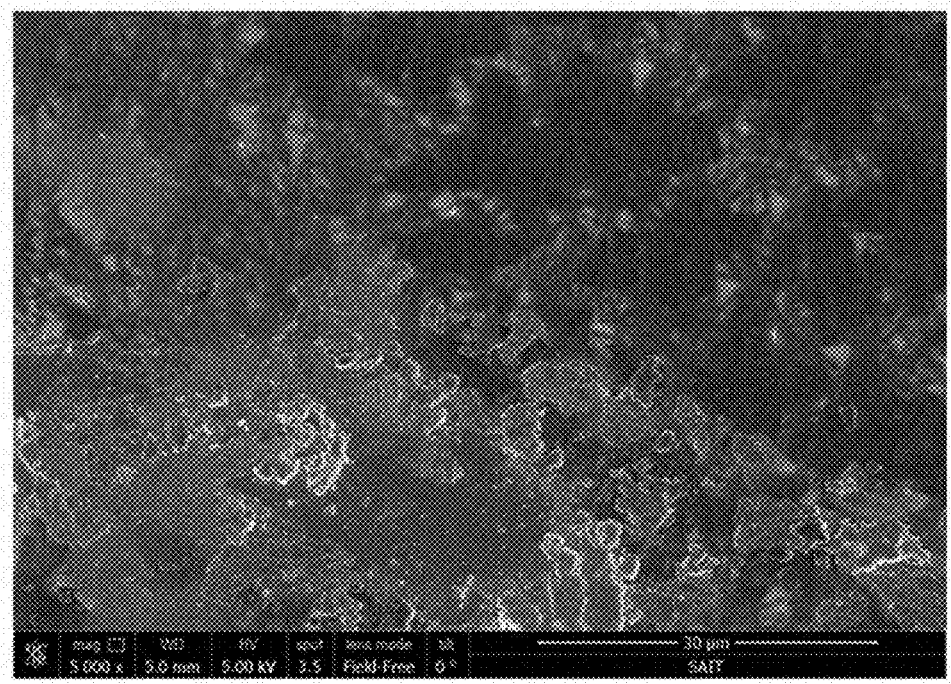

[4] Further, after the bending experiment of [3] is finished, the conductive components of Exemplary Embodiment 1 and the comparative example are measured using a scanning electron microscope (SEM), and the results are shown in FIGS. 6 and 7, respectively.

TABLE 3

| | Strain = 2.6% | | Strain = 6.7% | |
|---|---|---|---|---|
| | Exemplary Embodiment 1 | Comparative Example | Exemplary Embodiment 1 | Comparative Example |
| Resistance change ratio [%] | 1.6% | 2% | 21.4% | 97.8% |

Referring first to Table 3, in the low strain region (2.6%), it can be seen that the resistance change ratios of the conductive components of Exemplary Embodiment 1 and the comparative example are 1.6% and 2.0%, respectively, so they are similar to each other.

However, in the high strain region (6.7%), it can be seen that Exemplary Embodiment 1 shows the resistance change ratio of 21.4% while the comparative example shows the resistance change ratio of 97.8%. In addition, when the resistance change ratios between the low strain region (2.6%) and the high strain region (6.7%) are compared, it can be seen that the resistance change ratio in the comparative example is significantly increased since the resistance change ratio in Exemplary Embodiment 1 is increased by 19.8% and the resistance change ratio in the comparative example is increased by 95.8%. That is, it can be seen that the conductive component of Exemplary Embodiment 1 shows high reliability in the high strain region (6.7%) corresponding to the so-called "destruction region."

While not wanting to be bound by theory, it is understood that this is because destruction of the Ag nanowires and delamination of the graphene island-Ag nanowires are minimized in the destruction region having strain 6.7% or more, since the conductive component of Exemplary Embodiment 1 is reinforced not only in mechanical flexibility by the graphene island but also in binding strength between the graphene island structures, the Ag nanowires, and the substrate.

FIGS. 6 and 7 are photographs of the conductive component after it is bent in the high strain region, and FIGS. 6 and 7 illustrate the image of Exemplary Embodiment 1 and the image of the comparative example, respectively.

In the case of Exemplary Embodiment 1, as illustrated in FIG. 6, it can be seen that delamination of a top surface of the conductive component does not occur even if it is repeatedly bent in the high strain region (6.7%), while in the case of the comparative example, as illustrated in FIG. 7, it can be seen that delamination of the graphene island and/or Ag nanowire mesh structures from the substrate occurs and thus the conductive component is internally damaged.

While not wanting to be bound by theory, it is understood that this is because, in the conductive component of Exemplary Embodiment 1 as opposed to in the comparative example, the graphene islands having relatively good adhesive strength with respect to the substrate are formed directly on the substrate, and additionally, the binding strength between the substrate, the graphene islands, and Ag nanowire mesh structures is reinforced by the overcoat layer.

Manufacture of Exemplary Embodiment 2

A conductive component of Exemplary Embodiment 2 may be manufactured by the following method.

[1] A laminated body of PET-graphene island structures in which two or more island structures are formed on a PET substrate by the same process as in Exemplary Embodiment 1.

[2] 0.3 milligrams (mg) to 6 mg of gold trichloride ($AuCl_3$) as a dopant and 1 mL of nitromethane as a solvent are mixed together, and the mixture is doped to the graphene island structures of the PET-graphene island structures. The content of doped gold (Au) may be 0.1 parts by weight to 4 parts by weight when the total weight of the first layer is 100.

[3] A second layer and an overcoat layer are sequentially formed on the graphene island structures doped with gold using the same method as in Exemplary Embodiment 1 described above, such that a conductive component in which the substrate, the first layer including the graphene island structures doped with gold, the second layer including the conductive nanowires, and the overcoat layer are sequentially laminated and hybridized.

That is, during the manufacturing process of the conductive component, by additionally performing a doping process for the graphene island structures as in Exemplary Embodiment 2, the hybridized conductive component different from that of Exemplary Embodiment 1 may also be manufactured, and the conductivity of the conductive component may be additionally improved by doping the graphene island structures as in Exemplary Embodiment 2.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A conductive component comprising:
a substrate;
a first layer comprising a plurality of island structures disposed directly on the substrate, wherein the island structures comprise graphene;
a second layer which is disposed directly on the first layer, wherein the second layer comprises a plurality of conductive nanowires; and
an overcoat layer which is disposed on and covers at least a top surface of the second layer,
wherein the overcoat layer passes through the second and first layers and is connected to the substrate.

2. The conductive component of claim 1, wherein a first length of an island structure of the plurality of island structures is about 0.05 micrometers to about 100 micrometers, wherein the first length is a maximum length connecting any two points of an island structure, and wherein the first length is parallel to a surface of the substrate.

3. The conductive component of claim 2, wherein a second length of the island structure is greater than 0 nanometers and less than or equal to about 1.05 nanometers, wherein the second length is a maximum length of a perpendicular line extending from a single point of the island structure to a surface of the substrate, and wherein the second length is in a direction perpendicular to a top surface of the substrate.

4. The conductive component of claim 1, wherein the island structures comprise a dopant.

5. The conductive component of claim 4, wherein the dopant comprises a metal halide, a nitrogen-containing compound, a sulfur oxide, a metal peroxide, or a combination thereof.

6. The conductive component of claim 5, wherein the metal halide comprises $AuCl_3$, $FeCl_3$, $MoCl_5$, $WCl_5$, $SnCl_4$, $MoF_5$, $RuF_5$, $TaBr_5$, $SnI_4$, $HAuCl_4$, or a combination thereof.

7. The conductive component of claim 5, wherein the nitrogen-containing compound comprises $HNO_3$, $AgNO_3$, $NO_2F$, $NO_2Cl$, $N_2O_5$, $NO_2BF_4$, $CH_3NO_2$, $NO(SbCl_6)$, $NOBF_4$, $NOClO_4$, $NOSO_4H$, $NOCl$, $NOF$, $NOBr$, or a combination thereof.

8. The conductive component of claim 5, wherein the nitrogen-containing compound comprises a substituted or unsubstituted pyrrole, imidazole, pyrazole, pyridine, pyrazine, pyrimidine, pyridazine, indole, quinoline, benzoquinoline, benzimidazole, triazine, carbazole, or a combination thereof.

9. The conductive component of claim 1, wherein light transmittance of the first layer is 99% or more.

10. The conductive component of claim 1, wherein a sheet resistance of the conductive component is about 20 ohms per square to about 100 ohms per square.

11. The conductive component of claim 1, wherein a haze of the conductive component is less than or equal to 1.5%.

12. The conductive component of claim 1, wherein the second layer comprises a nanowire mesh structure in which the conductive nanowires are tangled together.

13. The conductive component of claim 1, wherein the conductive nanowire comprises silver, copper, gold, aluminum, nickel, cobalt, palladium, or a combination thereof.

14. The conductive component of claim 1, wherein the conductive component is a transparent electrode, a flexible transparent electrode, a transparent sensor, or a flexible transparent sensor.

15. An electronic device comprising the conductive component of claim 1.

16. The electronic device of claim 15, wherein the electronic device is a flat panel display, a curved display, a touch screen panel, a solar cell, an e-window, an electrochromic mirror, a heat mirror, a transparent transistor, a flexible display, a flexible touch screen panel, a flexible solar cell, a flexible e-window, a flexible electrochromic mirror, or a flexible heat mirror.

* * * * *